(12) United States Patent
Wong et al.

(10) Patent No.: US 11,658,670 B2
(45) Date of Patent: May 23, 2023

(54) SYSTEM AND METHOD OF DIGITAL TO ANALOG CONVERSION ADAPTIVE ERROR CANCELLING

(71) Applicant: Avago Technologies International Sales Pte. Limited, Singapore (SG)

(72) Inventors: Koon Lun Jackie Wong, Irvine, CA (US); Chi-Hung Lin, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 177 days.

(21) Appl. No.: 17/160,529

(22) Filed: Jan. 28, 2021

(65) Prior Publication Data
US 2022/0239303 A1 Jul. 28, 2022

(51) Int. Cl.
  H03M 1/06 (2006.01)
  H03M 1/10 (2006.01)
  H04B 1/04 (2006.01)
(52) U.S. Cl.
  CPC ....... *H03M 1/0617* (2013.01); *H03M 1/1009* (2013.01); *H04B 1/04* (2013.01)
(58) Field of Classification Search
  CPC .................................................... H03M 1/0617
  USPC ......................................................... 375/295
  See application file for complete search history.

(56) References Cited

U.S. PATENT DOCUMENTS

| 7,545,295 B2 | 6/2009 | Lin | |
| 9,577,657 B1* | 2/2017 | Clara | ...................... H03M 3/38 |
| 2011/0098956 A1* | 4/2011 | Vennelakanti | ....... G01R 35/005 |
| | | | 702/85 |

OTHER PUBLICATIONS

Elbert Bechthum et al: "Timing error measurement for highly linear wideband Digital to Analog Converters", Circuits and Systems (ISCAS), 2011 IEEE International Symposium on, IEEE, May 15, 2011 (May 15, 2011), pp. 2019-2022.
Extended European Search Report—221522105 dated Jun. 23, 2022.
Georgi Ivanov Radulov: "Flexible and self-calibrating current-steering Digital-to-Analog Converters: analysis, classification and design", Jan. 14, 2010 (Jan. 14, 2010).
Greenwald Elliot et al: "A CMOS Current Steering Neurostimulation Array With Integrated DAC Calibration and Charge Balancing", IEEE Transactions on Biomedical Circuits and Systems, IEEE, US, vol. 11, No. 2, Apr. 1, 2017 (Apr. 1, 2017), pp. 324-335.

* cited by examiner

*Primary Examiner* — Lihong Yu
(74) *Attorney, Agent, or Firm* — Foley & Lardner LLP

(57) ABSTRACT

The systems and methods discussed herein related to digital to analog conversion. A digital to analog conversion circuit can includes a digital input, an analog output, and a cell array. The digital to analog converter can also include an integrator, an analog to digital converter (ADC), and a summer coupled to the ADC, and an adaptation circuit coupled to the summer. The adaption circuit provides controls signals to the cell array.

20 Claims, 6 Drawing Sheets

SYSTEM AND METHOD OF DIGITAL TO ANALOG CONVERSION ADAPTIVE ERROR CANCELLING

FIELD OF THE DISCLOSURE

This disclosure generally relates to systems and methods for digital to analog conversion.

BACKGROUND

In the last few decades, the market for integrated circuit devices has grown by orders of magnitude, fueled by the need for portable devices, and increased connectivity and data transfer between all manners of devices. Digital to analog conversion is widely used in these integrated circuit devices techniques in analog and mixed-signal circuit systems especially for high sampling rate applications. Digital to analog converters (DACS) are often provided in communication circuits as well as other types of circuits that use analog and digital signals.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 1 is a general schematic block diagram of a communication system according to some embodiments;

FIG. 2 is a general schematic block diagram of a communication system according to some embodiments;

FIG. 3A is a more detailed schematic block diagram of a digital to analog converter for the communication system illustrated FIGS. 1 and 2 according to some embodiments;

FIG. 3B is a graph of an output of the digital to analog converter of the communication system illustrated FIG. 3A according to some embodiments;

FIG. 3C is a graph an output of an integrator of the digital to analog converter of the communication system illustrated FIG. 3A according to some embodiments;

FIG. 4A is a block diagram depicting an embodiment of a network environment including one or more access points in communication with one or more devices or stations; and FIGS. 4B and 4C are block diagrams depicting embodiments of computing devices useful in connection with the methods and systems described herein.

DETAILED DESCRIPTION

The following standard(s), including any draft versions of such standard(s), are hereby incorporated herein by reference in their entirety and are made part of the present disclosure for all purposes: IEEE 802.11x, IEEE 802.11ad, IEEE 802.11ah, IEEE 802.11aj, IEEE 802.16 and 802.16a, and IEEE 802.11ac, IEEE P802.3™ and Data Over Cable Service Interface Specification Standards (D3.1 and D4.0). Although this disclosure may reference aspects of these standard(s), the disclosure is in no way limited by these standard(s).

For purposes of reading the description of the various embodiments below, the following descriptions of the sections of the specification and their respective contents may be helpful:

Section A describes embodiments of systems and methods for digital to analog conversion; and Section B describes a network environment and computing environment which may be useful for practicing embodiments described herein.

A. Systems and Methods for Digital to Analog Conversion

Digital to analog data converters (DACS) are utilized in various wireless and wired communication devices as well as other mixed signal systems. In one exemplary application, data over cable service interface specifications (DOCSIS) modems use transmitters that include DACS and enable high-bandwidth data transfer via existing coaxial cable systems associated with the transmission of cable television program signals (CATVS). Other communication systems that use DACS include but are not limited to: IEEE 802.3bp and 802.3bw for 1000BASE-T1 (1 Gbps) Ethernet and 100BASE-T1 (100 Mbps) communication systems, and 802.11 communication systems. DACS are also used in processors, microcontrollers and other circuits that process digital data and transmit analog signals.

Some embodiments of the systems and methods of digital to analog conversion are used with DOCSIS systems (D3.1, D4.0) and enable exceedingly high Spurious-Free Dynamic Range (SFDR) performance according to the DOCSIS standards. Some embodiments of the systems and methods adaptively reduce both amplitude error and timing error which adversely affect SFDR performance. In some embodiments, the systems and methods of digital to analog conversion do not require a high over-sampling ratio to capture the timing error accurately. In some embodiments, the systems and methods of digital to analog conversion can efficiently cancel the timing error in the voltage-domain without requiring a high-complexity digital logic to calculate the correction dynamically.

In some embodiments, an adaptive DAC cancels amplitude and timing error to improve the accuracy at reduced DAC sampling frequency. In some embodiments, an integrator is used to completely capture the energy transmitted from the DAC, replacing the approximation from an oversampling ADC. In some embodiments, error correction circuits are built into cells of the DAC, and a secondary correction DAC and complicated digital logic for the secondary correction DAC is not required. Using the integrator, an analog to digital converter (ADC), and the correction circuits inside the DAC cells provides an adaptive DAC that can operate at much faster speed and can consume less power with more accurate correction according to some embodiments.

Some embodiments relate to a digital to analog converter. The digital to analog converter includes a digital to analog conversion circuit. The digital to analog conversion circuit includes a digital input, an analog output, and a cell array. The digital to analog converter also includes an integrator, an analog to digital converter (ADC), a summer coupled to the ADC, and an adaptation circuit coupled to the summer. The integrator integrates the energy of the DAC output to become a voltage, and the ADC digitizes this voltage to its digital representation, which then gets subtracted by the digital input via the summer to form an error signal, which then gets fed into the adaptation circuit to control the correction circuits inside the DAC cells.

Some embodiments relate to a method. The method includes providing a digital signal to an input of a digital to analog converter circuit, providing an analog signal at an output of the digital to analog converter circuit, and integrating the analog signal or a version of the analog signal to provide an integrated signal. The method also includes providing a digitized representation of the integrated signal through the ADC. The method also includes providing an error signal representative of a difference between the digitized representation of the integrated signal and the digital input signal, and adjusting calibration paths within the digital to analog converter circuit in response to the error signal.

Some embodiments relate to a transmitter. The transmitter includes a digital to analog conversion circuit and a control circuit. The digital to analog conversion circuit includes a digital input, an analog output, and a number of cells. The control circuit is configured to receive an error signal and provide control signals. The error signal is representative of a difference between a digitized representation of the integrated signal of an analog signal at the analog output or a version of the analog signal and the digital signal. Each of the control signals is associated with a respective cell of the cells to adjust an amplitude, a time delay or both the amplitude and the time delay to reduce an error.

Figure 1:
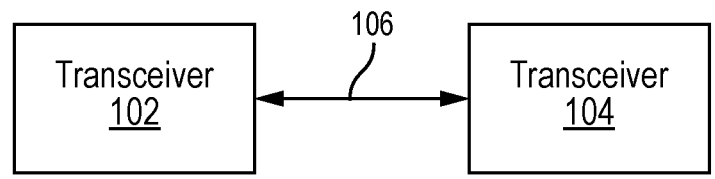
Figure 2:

With reference to FIG. 1, a communication system 9 includes a first transceiver 102 and second transceiver 104 in communication via a twisted pair conductive medium, single-pair conductive medium, coaxial cable, or conductor 106 in some embodiments. In some embodiments, the communication system 9 is wireless communication system (FIG. 2) and does not include conductor 106 or use a conductor 106. The communication system 9 can be any type of communication system including but not limited to DOCSIS system, an Ethernet system, an automotive communications system, an 802.11 system, etc. Conductor 106 can be a single ended conductor or a differential pair of conductors and can be any communication medium for communications in some embodiments.

The transceivers 102 and 104 may be part of other devices (not illustrated), such as vehicle components, television systems, satellite systems, cable modems, telephonic devices, computing devices, cameras, displays, network devices, or any other type and form of electronic device utilizing a communications system. The transceivers 102 and 104 can be part of local area networks, wide area networks, and include DOCSIS transmitters, ethernet transmitters, wireless transmitters, or other communication circuits.

Figure 3A:
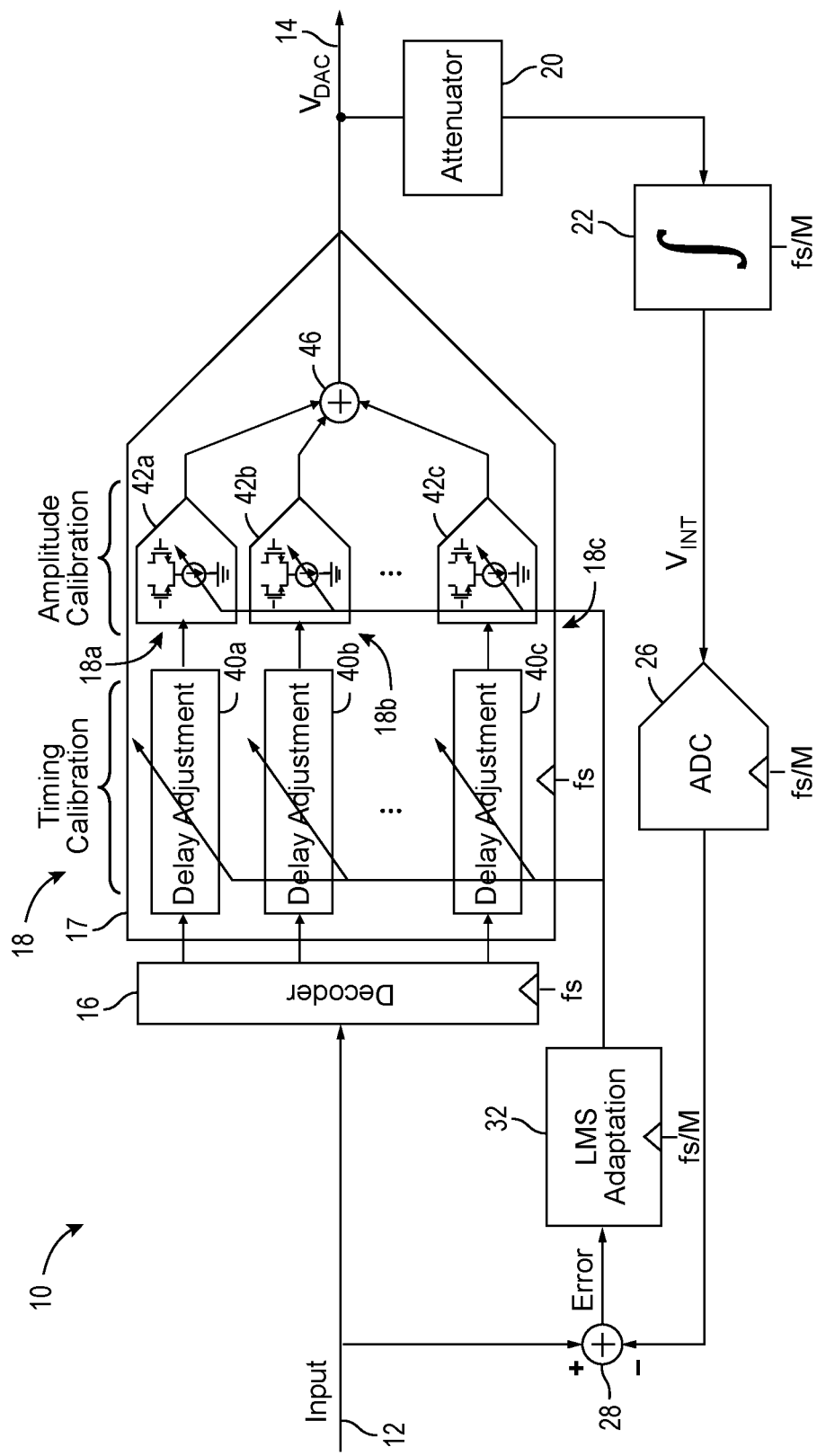

With reference to FIG. 3A, a digital to analog converter (DAC) 10 is provided on a physical (PHY) chip or integrated circuit in a package. In some embodiments, transceiver 102 or transceiver 104 includes DAC 10. The DAC 10 can be part of a transmitter and can be a radio frequency DAC. The systems and methods described herein with respect to DAC 10 can be used for foreground or background calibration of different DAC architectures in a wide range of high-speed and high-resolution applications.

DAC 10 includes a digital input 12, an analog output 14, a decoder 16, a digital to analog conversion circuit 17, an attenuator 20, an integrator 22, an analog to digital converter 26, a summer 28, and an adaptation circuit 32 in some embodiments. In some embodiments, the attenuator 20 is not included in DAC 10, and the analog output 14 is directly coupled to the integrator 22. The digital input of the DAC 10 can be a training signal, or a real data signal.

The digital to analog conversion circuit 17 can be a current mode or voltage mode conversion circuit. The digital to analog conversion circuit 17 operates at a sampling rate of $F_S$ and includes a cell array 18 and a summer 46. A clock signal drives the sampling of the digital to analog conversion circuit 17 at a clock input of the digital to analog conversion circuit 17. The clock signal can have a frequency of 204.8 megahertz (MHz) in embodiment. In some embodiments the sampling rate $F_S$ is or is a multiple of 204.8 megahertz (MHz). Other sampling rates and frequencies of clock signals can be utilized.

The cell array 18 includes an array of channels or cells 18a-c. The cells 18a-c include respective delay adjustment circuits 40a-c and respective amplitude adjustment circuits 42a-c. The cell array 18 can include any integer number of cells 18a-c from 1 to P, where P equals 2, 3, 4, 5, . . . , 8, . . . , 16, . . . , 32, etc. The number of delay adjustment circuits 40a-c and the number of amplitude adjustment circuits 42a-c is equal to the number of cells 18a-c in cell array 18 in some embodiments. The cell array 18 provides current or voltage according to the digital signal at the digital input 12 for summing in the summer 46. Summer 46 provides the analog signal to the analog output 14 corresponding to the digital signal or data provided at the digital input 12. The delay adjustment circuits 40a-c are configured as calibration circuits to adjust timing to compensate for timing errors in some embodiments. The amplitude adjustment circuits 42a-c are configured as calibration circuits to adjust amplitude to compensate for amplitude errors in some embodiments. The delay adjustment circuits 40a-c and the amplitude adjustment circuits 42a-c are controlled by the adaptation circuit 32 in some embodiments.

The decoder 16 is a binary combinatorial logic device that decodes the digital input (e.g., an N-bit word) at the digital input 12 and into P separate bits (e.g., $2^N$=P). Each of the P separate bits is associated with a respective cell 18a-c. The P bits can be provided in a differential or single ended format. In a current mode DAC implementation, each of the cells 18a-c provides a current if the respective bit of the P separate bits indicates that the respective cell 18a-c should provide current for the analog signal at the analog output 14. In a voltage mode DAC implementation, each of the cells 18a-c provides a voltage if the respective bit of the P separate bits indicates that the respective cell 18a-c should provide voltage for the analog signal at the analog output 14. Timing of the provision of the voltage or current is adjusted by the delay adjustment circuits 40a-c. Amplitude of the voltage or current is adjusted by the amplitude adjustment circuits 42a-c.

The delay adjustment circuits 40a-c are variable delay circuits in some embodiments. The delay adjustment circuits 40a-c include selectable circuit paths, each having a particular delay. The selectable paths include resistive and/or capacitive components or features for implementing the particular delays in some embodiments.

The amplitude adjustment circuits 42a-c are variable gain circuits in some embodiments. The amplitude adjustment circuits 42a-c include amplifiers that include a controllable current source in some embodiments. The summer 46 receives the amplitude adjusted signals and is an operational amplifier-based summer in some embodiments. The summer 46 can include ladder circuitry.

The analog signal at the analog output 14 is provided to the attenuator 20. The attenuator 20 attenuates the analog signal for reception by the integrator 22. The attenuator 20 can be an active or passive impedance circuit. The attenuator 20 can be a resistive circuit in some embodiments. The attenuator 20 can be coupled directly to the integrator 22 in some embodiments.

The integrator 22 samples the analog signal or a derivation of the analog signal from the attenuator 20 at a sampling rate of $F_S/M$, where M is an integer greater than or equal to 1. M can equal 1, 2, 3, 4, . . . , 8, etc. The integrator 22 is driven by a clock signal at a frequency of $F_S/M$ in some embodiments. The period of integration $T_S$ is $1/F_S$ in some embodiments. The integrator 22 is configured to integrate the analog signal or a derivation of the analog signal over time (0 to $T_S$) triggered by a rising edge of the clock signal at the frequency of $F_S/M$ in some embodiments. The integrator is configured to capture the energy, area under the curve, of each sample of the analog signal in the period $T_S$. In some embodiments, the integrator 22 is a switched capacitor or operational amplifier/capacitor circuit.

The integrated signal for the integrator 22 is provided to the analog to digital converter 26. The analog to digital converter 26 samples the integrated signal at a sampling rate of $F_S/M$ and provides a digital signal to the summer 28. The analog to digital converter 26 is any device for converting the integrated analog signal to a digital representation (e.g., data) for the summer 28.

The summer 28 is a digital summer and is configured to provide a digital error signal to the adaptation circuit 32. The summer 28 samples the data from the analog to digital converter 26 and the digital input signal at the digital input 12 at a sampling rate of $F_S/M$. The summer 28 can be configured to provide a subtraction operation to provide the digital error to the adaptation circuit 32. The adaptation circuit 32 can make a timing adjustment, an amplitude adjustment, or both so that the digital input signal matches in time and the amplitude matches in voltage or current in each of the P separate bits in the respective cell 18a-c in some embodiments. The summer 28 can be a combinatorial, logic, or processor circuit for performing a mathematical operation in some embodiments.

The adaptation circuit 32 samples the digital error signal from the summer 28 at a sampling rate of $F_S/M$. The adaptation circuit 32 is a digital circuit or processor configured to provide control signals to control the delay adjustment circuits 40a-c to adjust timing to compensate for timing errors in some embodiments. The adaptation circuit 32 is a digital circuit, digital filter, or processor configured to provide control signals to control the amplitude adjustment circuits 42a-c to adjust amplitude to compensate for amplitude errors in some embodiments. The adaptation circuit 32 provides a least squares fit (e.g., least mean squares fit) operation to provide the control signals in some embodiments. The adaptation circuit 32 can use other algorithms (e.g., regression. error correction or fitting algorithms) to provide the control signals. The adaptation circuit 32 can be used in foreground and/or background operations. The adaptation circuit 32 is software controlled digital processing circuit in some embodiments.

Figure 3B:
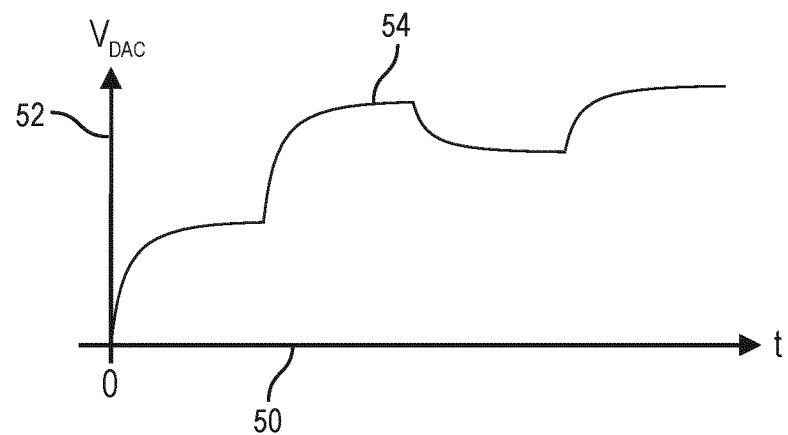

With reference to FIG. 3B, the analog output signal at the analog output 14 is represented on a graph including an X-axis 50 and a Y-axis 52. A curve 54 represents the analog output signal. The X-axis 50 represents time and the Y-axis 52 represents amplitude in volts.

Figure 3C:
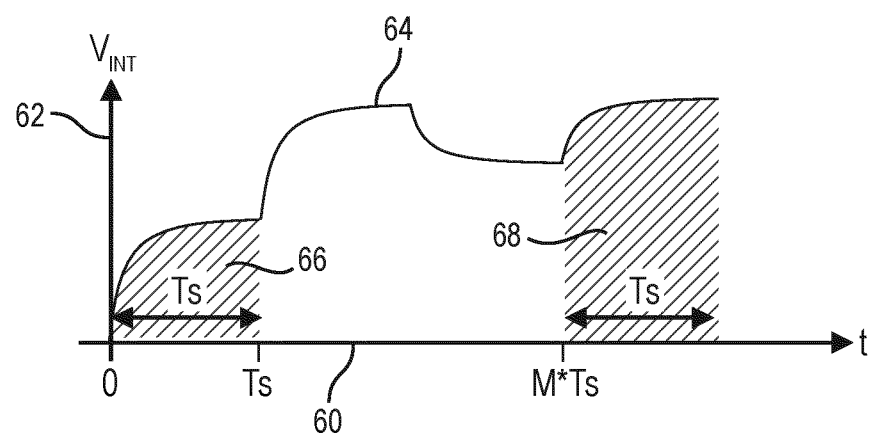

With reference to FIG. 3C, the integrated signal at the output of the integrator 22 is represented on a graph including an X-axis 60 and a Y-axis 62. A curve 64 represents the analog output signal. The X-axis 60 represents time and the Y-axis 62 represents amplitude in volts. An area 66 represents the energy of the integrated signal for the sampling period having a length $T_S$ from time 0 to $T_S$. An area 68 represents the energy of the integrated signal for another sampling period having a length $T_S$ from time $M*T_S$ to $(M+1)*T_S$. The characteristics of the analog signal using the areas 66 and 68 are more effectively captured due to the integrator 22.

Advantageously, the DAC 10 can achieve higher accuracy by using the integrator 22 to capture the energy transmitted from the DAC 10 in some embodiments. Both amplitude and timing information can completely captured via the integration by the integrator 22 without estimation by oversampling in some embodiments. Further, the DAC 10 can advantageously correct the timing error by adjusting the delay inside each cell 18a-c via the delay adjustment circuits 40a-c, instead of making correction in the wrong domain using a conventional amplitude-based correction DAC. By combining both the use of integrator 22 and the individual the amplitude adjustment circuits 42a-c and delay adjustment circuits 40a-c, both amplitude and timing errors are sensed and compensated more accurately in some embodiments. The DAC10 allows sub-sampling starting from the integrator 22 so that the analog to digital converter 26 and the adaptation circuit 32 can run at a slower speed to save power in some embodiments. By removing the bottleneck of an over-sampling ADC and correction DAC, the DAC 10 can operate at higher speed in some embodiments.

In some embodiments, the digital components of DAC 10 can be implemented using dedicated circuits or processor based circuits including, but not limited to: a central processing unit (CPU), graphics processing unit (GPU), microprocessor, application specific integrated circuit (ASIC), a field programmable gate array (FPGA), complementary metal-oxide-semiconductor (CMOS), or the like. In some examples, a memory for storing data and computer instructions is included, such as random-access memory (RAM), read-only memory (ROM), programmable read-only memory (PROM), erasable programmable read-only memory (EPROM), and electrically erasable programmable read-only memory (EEPROM), dynamic random-access memory (DRAM), static random-access memory (SRAM), Flash memory, or the like.

B. Computing and Network Environment

Figure 4A:
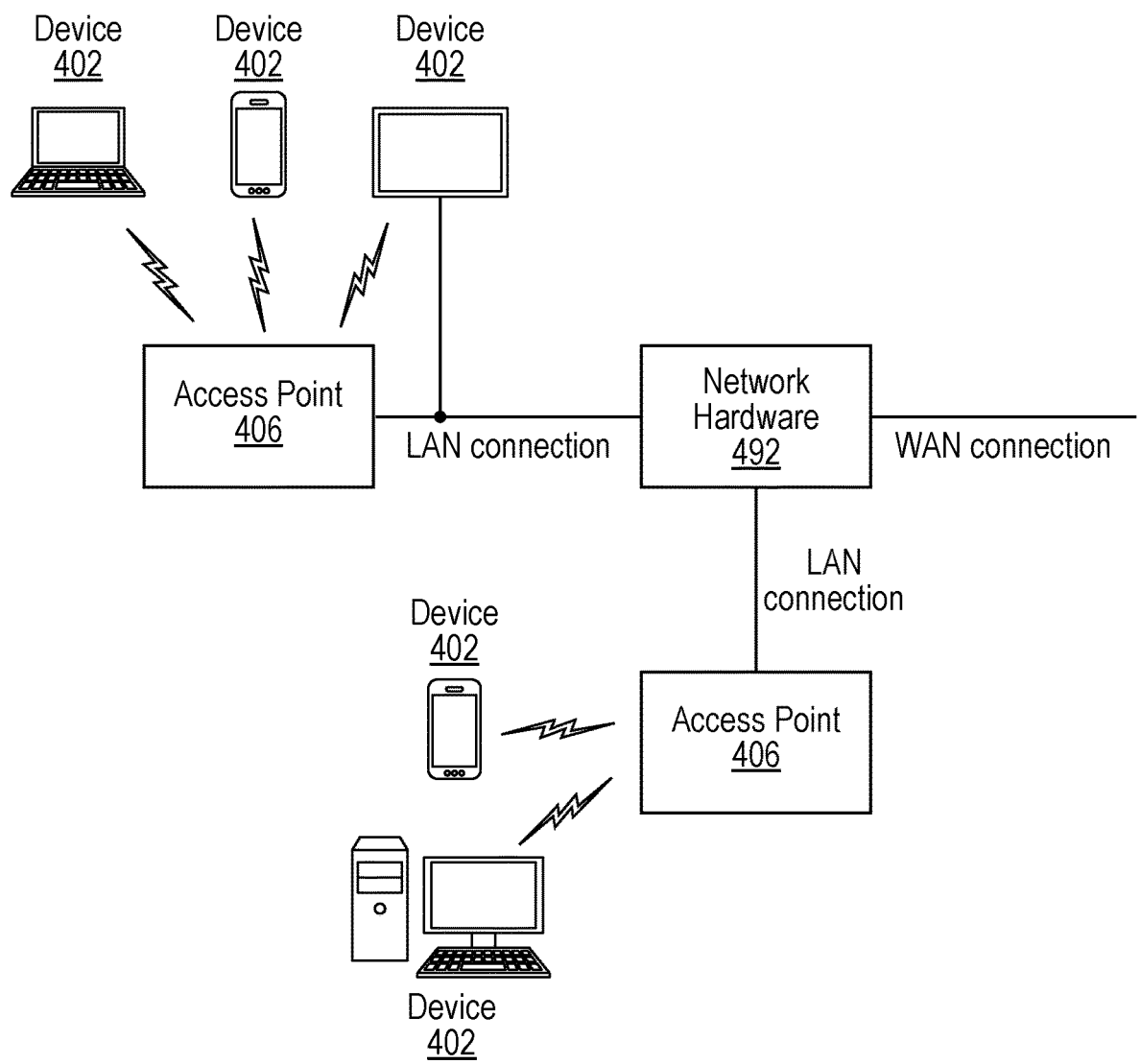

Having discussed specific embodiments of the present solution, it may be helpful to describe aspects of the operating environment as well as associated system components (e.g., hardware elements) in connection with the methods and systems described herein. Referring to FIG. 4A, an embodiment of a network environment is depicted which can utilize the transceiver 102 illustrated in FIG. 3 according to some embodiments. In brief overview, the network environment includes a wired or a wireless communication system that includes one or more access points 406, one or more wireless communication devices 402 which can include transceiver 102 and a network hardware component 492. The network environment can include (DOCSIS) modems that enable high-bandwidth data transfer via existing coaxial cable systems associated with the transmission of cable television program signals (CATVS). The wireless communication devices 402 may for example include televisions 402, laptop computers 402, tablets 402, personal computers 402 and/or cellular telephone devices 402. The details of an embodiment of each wireless communication device and/or access point are described in greater detail with reference to FIGS. 4B and 4C. The network environment can be an ethernet, an ad hoc network environment, an infrastructure wireless network environment, a subnet environment, etc. in one embodiment.

The access points (APs) 406 may be operably coupled to the network hardware 492 via local area network connections. The network hardware 492, which may include a router, gateway, switch, bridge, modem, system controller, appliance, etc., may provide a local area network connection for the communication system. Each of the access points 406 may have an associated antenna or an antenna array to communicate with the wireless communication devices 402 in its area. The wireless communication devices 402 may register with a particular access point 406 to receive services from the communication system (e.g., via a SU-MIMO or MU-MIMO configuration). For direct connections (e.g., point-to-point communications), some wireless communication devices 402 may communicate directly via an allocated channel and communications protocol. Some of the wireless communication devices 402 may be mobile or relatively static with respect to the access point 406.

In some embodiments an access point 406 includes a device or module (including a combination of hardware and software) that allows wireless communication devices 402 to connect to a wired network using Wi-Fi, or other standards. An access point 406 may sometimes be referred to as a wireless access point (WAP). An access point 406 may be configured, designed and/or built for operating in a wireless local area network (WLAN). An access point 406 may connect to a router (e.g., via a wired network) as a stand-alone device in some embodiments. In other embodiments, an access point can be a component of a router. An access point 406 can provide multiple devices 402 access to a network. An access point 406 may, for example, connect to a wired Ethernet connection and provide wireless connections using radio frequency links for other devices 402 to utilize that wired connection. An access point 406 may be built and/or configured to support a standard for sending and receiving data using one or more radio frequencies. Those standards, and the frequencies they use may be defined by the IEEE (e.g., IEEE 802.11 standards). An access point may be configured and/or used to support public Internet hotspots, and/or on an internal network to extend the network's Wi-Fi signal range.

In some embodiments, the access points 406 may be used for (e.g., in-home or in-building) wireless networks (e.g., IEEE 802.11, Bluetooth, ZigBee, any other type of radio frequency based network protocol and/or variations thereof). Each of the wireless communication devices 402 may include a built-in radio and/or is coupled to a radio. Such wireless communication devices 402 and/or access points 406 may operate in accordance with the various aspects of the disclosure as presented herein to enhance performance, reduce costs and/or size, and/or enhance broadband applications. Each wireless communication devices 402 may have the capacity to function as a client node seeking access to resources (e.g., data, and connection to networked nodes such as servers) via one or more access points 406.

The network connections may include any type and/or form of network and may include any of the following: a point-to-point network, a broadcast network, a telecommunications network, a data communication network, a computer network. The topology of the network may be a bus, star, or ring network topology. The network may be of any such network topology as known to those ordinarily skilled in the art capable of supporting the operations described herein. In some embodiments, different types of data may be transmitted via different protocols. In other embodiments, the same types of data may be transmitted via different protocols.

Figure 4B:
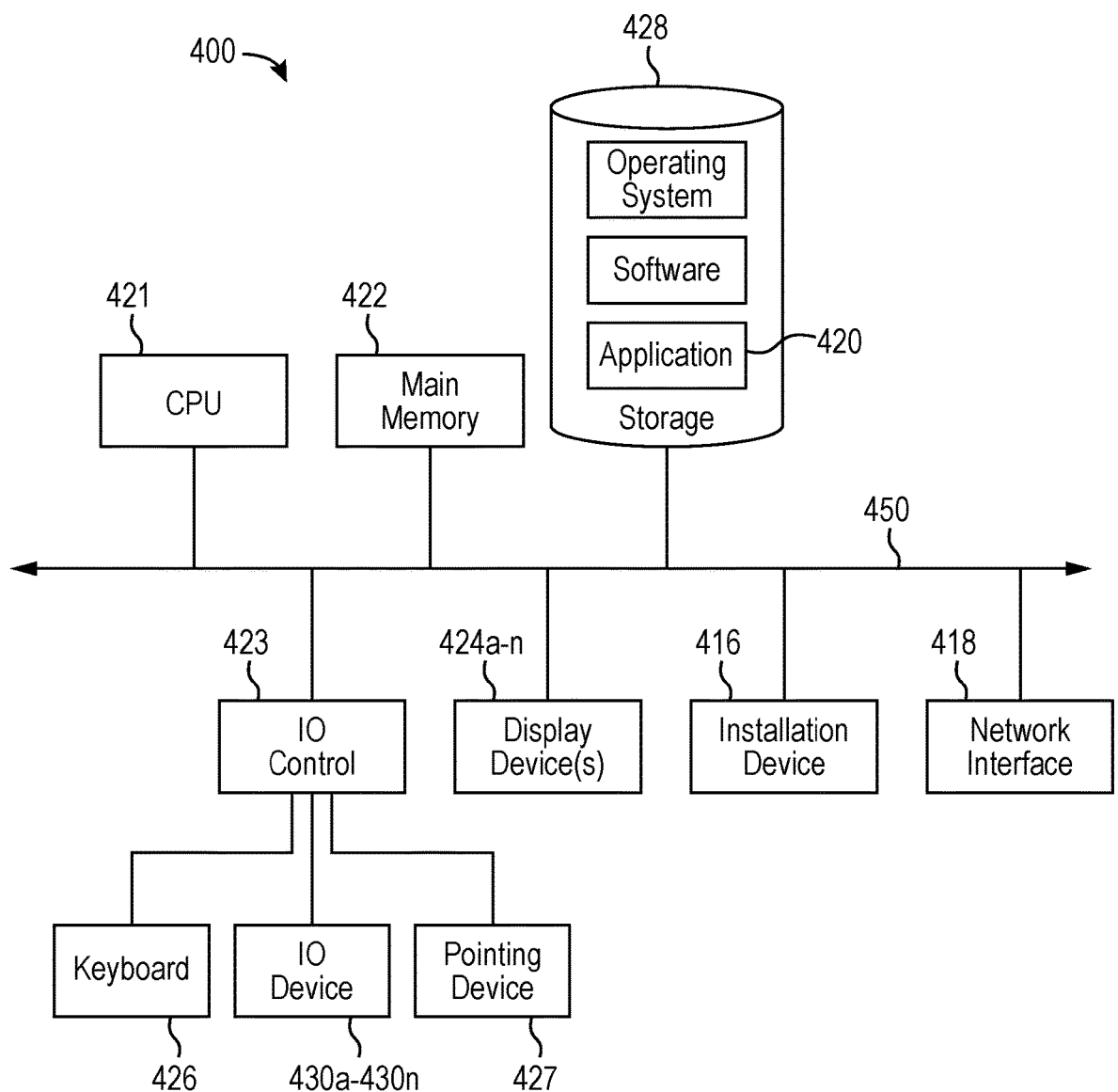
Figure 4C:
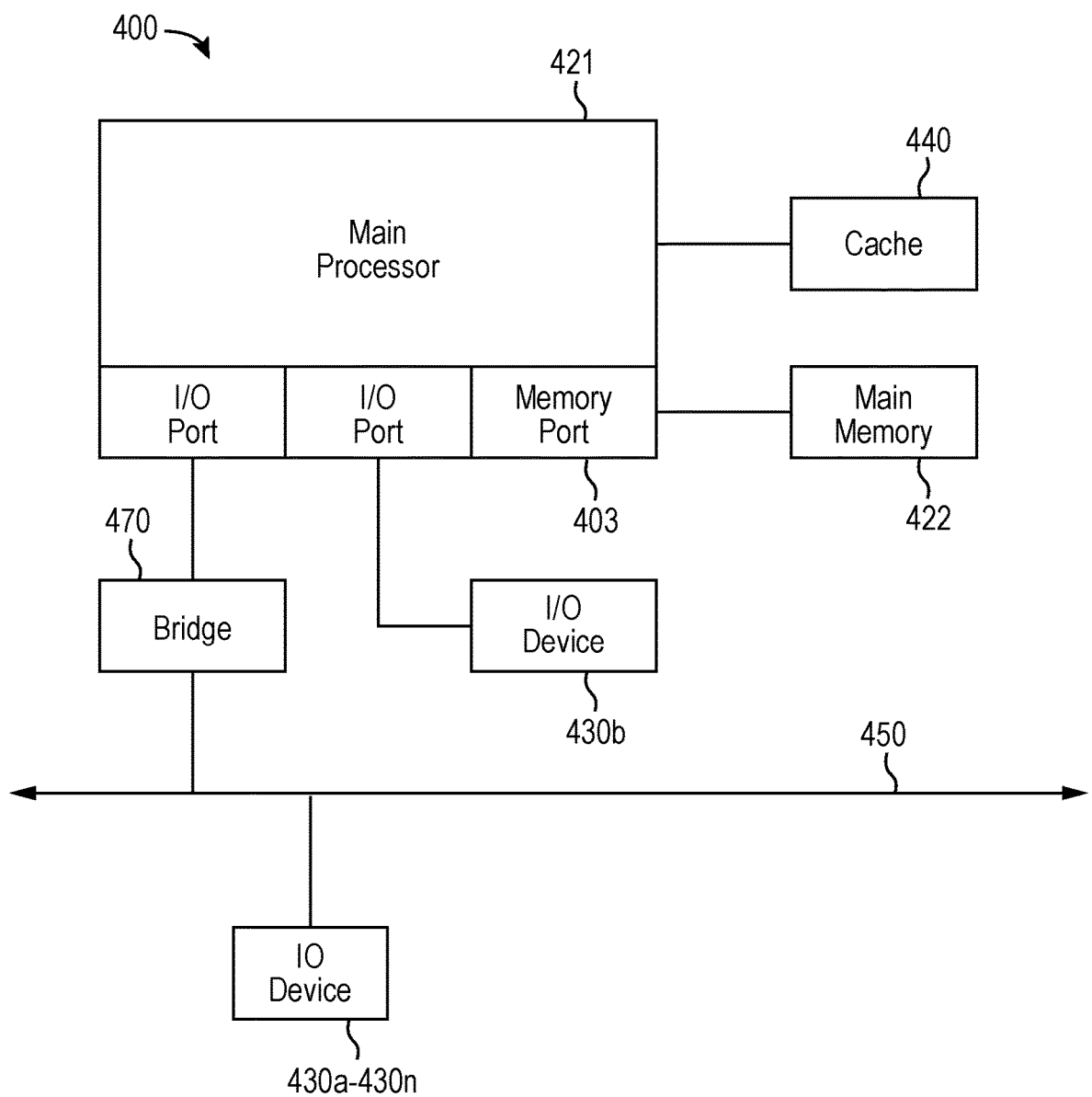

The communications device(s) 402 and access point(s) 406 may be deployed as and/or executed on any type and form of computing device, such as a computer, network device or appliance capable of communicating on any type and form of network and performing the operations described herein. FIGS. 4B and 4C depict block diagrams of a computing device 400 useful for practicing an embodiment of the wireless communication devices 402 or the access point 406. As shown in FIGS. 4B and 4C, each computing device 400 includes a central processing unit 421, and a main memory unit 422. As shown in FIG. 4B, a computing device 400 may include a storage device 428, an installation device 416, a network interface 418, an I/O controller 423, display devices 424a-424n, a keyboard 426 and a pointing device 427, such as a mouse. The storage device 428 may include, without limitation, an operating system and/or software. As shown in FIG. 4C, each computing device 400 may also include additional optional elements, such as a memory port 403, a bridge 470, one or more input/output devices 430a-430n (generally referred to using reference numeral 430), and a cache memory 440 in communication with the central processing unit 421.

The central processing unit 421 is any logic circuitry that responds to and processes instructions fetched from the main memory unit 422. In many embodiments, the central processing unit 421 is provided by a microprocessor unit, such as: those manufactured by Intel Corporation of Mountain View, Calif.; those manufactured by International Business Machines of White Plains, N.Y.; or those manufactured by Advanced Micro Devices of Sunnyvale, Calif. The computing device 400 may be based on any of these processors, or any other processor capable of operating as described herein.

Main memory unit 422 may be one or more memory chips capable of storing data and allowing any storage location to be directly accessed by the microprocessor 421, such as any type or variant of Static random access memory (SRAM), Dynamic random access memory (DRAM), Ferroelectric RAM (FRAM), NAND Flash, NOR Flash and Solid State Drives (SSD). The main memory 422 may be based on any of the above described memory chips, or any other available memory chips capable of operating as described herein. In the embodiment shown in FIG. 4B, the processor 421 communicates with main memory 422 via a system bus 450 (described in more detail below). FIG. 4C depicts an embodiment of a computing device 400 in which the processor communicates directly with main memory 422 via a memory port 403. For example, in FIG. 4C the main memory 422 may be DRDRAM.

FIG. 4C depicts an embodiment in which the main processor 421 communicates directly with cache memory 440 via a secondary bus, sometimes referred to as a backside bus. In other embodiments, the main processor 421 communicates with cache memory 440 using the system bus 450. Cache memory 440 typically has a faster response time than main memory 422 and is provided by, for example, SRAM, BSRAM, or EDRAM. In the embodiment shown in FIG. 4C, the processor 421 communicates with various I/O devices 430 via a local system bus 450. Various buses may be used to connect the central processing unit 421 to any of the I/O devices 430, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 424, the processor 421 may use an Advanced Graphics Port (AGP) to communicate with the display 424. FIG. 4C depicts an embodiment of a computer 400 in which the main processor 421 may communicate directly with I/O device 430b, for example via HYPERTRANSPORT, RAPIDIO, or INFINIBAND communications technology. FIG. 4C also depicts an embodiment in which local busses and direct communication are mixed: the processor 421 communicates with I/O device 430a using a local interconnect bus while communicating with I/O device 430b directly.

A wide variety of I/O devices 430a-430n may be present in the computing device 400. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices may be controlled by an I/O controller 423 as shown in FIG. 4B. The I/O controller may control one or more I/O devices such as a keyboard 426 and a pointing device 427, e.g., a mouse or optical pen. Furthermore, an I/O device may also provide storage and/or an installation medium 416 for the computing device 400. In still other embodiments, the computing device 400 may provide USB connections (not shown) to receive handheld USB storage devices such as the USB Flash Drive line of devices manufactured by Twintech Industry, Inc. of Los Alamitos, Calif.

Referring again to FIG. 4B, the computing device 400 may support any suitable installation device 416, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 400 may further include a storage device, such as one or more hard disk drives or redundant arrays of independent disks, for storing an operating system and other related software, and for storing application software programs such as any program or software 420 for implementing (e.g., configured and/or designed for) the systems and methods described herein. Optionally, any of the installation devices 416 could also be used as the storage device. Additionally, the operating system and the software can be run from a bootable medium.

Furthermore, the computing device 400 may include a network interface 418 to interface to the network 404 through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the computing device 400 communicates with other computing devices 400' via any type and/or form of gateway or tunneling protocol such as Secure Socket Layer (SSL) or Transport Layer Security (TLS). The network interface 418 may include a built-in network adapter, network interface card, PCMCIA network card, card bus network adapter, wireless network adapter, USB network adapter, modem or any other device suitable for interfacing the computing device 400 to any type of network capable of communication and performing the operations described herein.

In some embodiments, the computing device 400 may include or be connected to one or more display devices 424a-424n. As such, any of the I/O devices 430a-430n and/or the I/O controller 423 may include any type and/or form of suitable hardware, software, or combination of hardware and software to support, enable or provide for the connection and use of the display device(s) 424a-424n by the computing device 400. For example, the computing device 400 may include any type and/or form of video adapter, video card, driver, and/or library to interface, communicate, connect or otherwise use the display device(s) 424a-424n. In one embodiment, a video adapter may include multiple connectors to interface to the display device(s) 424a-424n. In other embodiments, the computing device 400 may include multiple video adapters, with each video adapter connected to the display device(s) 424a-424n. In some embodiments, any portion of the operating system of the computing device 400 may be configured for using multiple displays 424a-424n. One ordinarily skilled in the art will recognize and appreciate the various ways and embodiments that a computing device 400 may be configured to have one or more display devices 424a-424n.

In further embodiments, an I/O device 430 may be a bridge between the system bus 450 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device 400 of the sort depicted in FIGS. 4B and 4C may operate under the control of an operating system, which control scheduling of tasks and access to system resources. The computing device 400 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7 and 8, produced by Microsoft Corporation of Redmond, Wash.; MAC OS, produced by Apple Computer of Cupertino, Calif.; WebOS, produced by Research In Motion (RIM); OS/2, produced by International Business Machines of Armonk, N.Y.; and Linux, a freely-available operating system distributed by Caldera Corp. of Salt Lake City, Utah, or any type and/or form of a Unix operating system, among others.

The computer system 400 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication. The computer system 400 has sufficient processor power and memory capacity to perform the operations described herein.

In some embodiments, the computing device 400 may have different processors, operating systems, and input devices consistent with the device. For example, in one embodiment, the computing device 400 is a smart phone, mobile device, tablet or personal digital assistant. In still other embodiments, the computing device 400 is an Android-based mobile device, an iPhone smart phone manufactured by Apple Computer of Cupertino, Calif., or a Blackberry or WebOS-based handheld device or smart phone, such as the devices manufactured by Research In Motion Limited. Moreover, the computing device 400 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Although the disclosure may reference one or more "users", such "users" may refer to user-associated devices or stations (STAs), for example, consistent with the terms "user" and "multi-user" typically used in the context of a multi-user multiple-input and multiple-output (MU-MIMO) environment.

Although examples of communications systems described above may include devices and APs operating according to an 802.11 standard, it should be understood that embodiments of the systems and methods described can operate according to other standards and use wireless communications devices other than devices configured as devices and APs. For example, multiple-unit communication interfaces associated with cellular networks, satellite communications, vehicle communication networks, and other non-802.11 wireless networks can utilize the systems and methods described herein to achieve improved overall capacity and/or link quality without departing from the scope of the systems and methods described herein.

It should be noted that certain passages of this disclosure may reference terms such as "first" and "second" in connection with devices, mode of operation, transmit chains, antennas, etc., for purposes of identifying or differentiating one from another or from others. These terms are not intended to merely relate entities (e.g., a first device and a second device) temporally or according to a sequence, although in some cases, these entities may include such a relationship. Nor do these terms limit the number of possible entities (e.g., devices) that may operate within a system or environment.

It should be understood that the systems described above may provide multiple ones of any or each of those components and these components may be provided on either a standalone machine or, in some embodiments, on multiple machines in a distributed system. In addition, the systems and methods described above may be provided as one or more computer-readable programs or executable instructions embodied on or in one or more articles of manufacture. The article of manufacture may be a floppy disk, a hard disk, a CD-ROM, a flash memory card, a PROM, a RAM, a ROM, or a magnetic tape. In general, the computer-readable programs may be implemented in any programming language, such as LISP, PERL, C, C++, C#, PROLOG, or in any byte code language such as JAVA. The software programs or executable instructions may be stored on or in one or more articles of manufacture as object code.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

While the switches in the above described figure(s) can be field effect transistors (FETs), as one of ordinary skill in the art will appreciate, the switches may be implemented using any type of micromechanical switch (MEMS) of transistor structure including, but not limited to, bipolar, metal oxide semiconductor field effect transistors (MOSFET), N-well transistors, P-well transistors, enhancement mode, depletion mode, and zero voltage threshold (VT) transistors.

The transmitter has been described above with the aid of functional building blocks illustrating the performance of certain significant functions. The boundaries of these functional building blocks have been arbitrarily defined for convenience of description. Functions and structures can be integrated together across such boundaries. Alternate boundaries could be defined as long as the certain significant functions are appropriately performed. Similarly, flow diagram blocks may also have been arbitrarily defined herein to illustrate certain significant functionality. To the extent used, the flow boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

We claim:

1. A digital to analog converter, comprising:
   a digital to analog conversion circuit comprising a digital input, an analog output, and a cell array;
   an integrator;
   an analog to digital converter (ADC);
   a summer coupled to an ADC, wherein the integrator, the ADC, and the summer are coupled between the digital input and the analog output, the summer being configured to provide an error signal in response to an input at the digital input and a data derived from an output of the integrator, wherein the integrator receives an analog signal and provide an integrated signal at the output of the integrator; and
   an adaptation circuit coupled to the summer, wherein the adaptation circuit provides controls signals to the cell array.

2. The digital to analog converter of claim 1, wherein the control signals cause the cell array to adjust delay to reduce timing error.

3. The digital to analog converter of claim 1, wherein the control signals cause the cell array to adjust amplitude to reduce amplitude error.

4. The digital to analog converter of claim 3, wherein the control signals cause the cell array to adjust delay to reduce timing error.

5. The digital to analog converter of claim 1, further comprising:
   a decoder coupled between the digital input and the digital to analog conversion circuit, wherein the decoder comprises a plurality of decoder outputs coupled to respective calibration paths in the cell array, wherein the decoder operates at a first sampling rate less than a second sampling rate, wherein the integrator samples the analog signal at the second sampling.

6. The digital to analog converter of claim 5, wherein calibrations paths each comprise a delay adjustment circuit and an amplitude adjustment circuit.

7. The digital to analog converter of claim 1, wherein the adaptation circuit provides a least squares fit operation.

8. The digital to analog converter of claim 1, wherein the ADC is
   disposed between the integrator and the summer.

9. The digital to analog converter of claim 1, wherein the digital to analog converter is configured as a wireless digital to analog converter.

10. The digital to analog converter of claim 1, wherein the integrator and the adaptation circuit operates at a sampling rate of $F_S/M$, where $F_S$ is the sampling rate of the digital to analog conversion circuit and M is an integer greater than or equal to 1.

11. A method, comprising:

sampling a digital signal to an input of a digital to analog converter circuit at a first sampling rate;

providing an analog signal at an output of the digital to analog converter circuit;

sampling the analog signal or a version of the analog signal at a second sampling rate less than the first sampling rate and integrating the sampled analog signal or the version of the analog signal to provide an integrated signal;

providing an error signal representative of a difference between a digitized representation of the integrated signal and the digital signal; and adjusting calibration paths within the digital to analog converter circuit in response to the error signal.

12. The method of claim 11, further comprising:

attenuating the analog signal to provide the version of the analog signal for integrating to provide the integrated signal.

13. The method of claim 11, further comprising:

using a least squares fit to provide control signals for adjusting the calibration paths within the digital to analog converter circuit in response to the error signal.

14. The method of claim 11, further comprising:

converting the integrated signal to a digital form.

15. A transmitter, comprising:

a digital to analog conversion circuit comprising a digital input, an analog output, and a plurality of cells; and a control circuit configured to receive an error signal and provide control signals, the error signal being representative of a difference between a digitized representation of an integrated signal of an analog signal at the analog output or a version of the analog signal and a digital signal at the digital input, wherein each of the control signals is associated with a respective cell of the cells to adjust an amplitude, a time delay or both the amplitude and the time delay to reduce an error, wherein the digital signal at the digital input of the digital to analog conversion circuit is sampled at a first sampling rate, and wherein the analog signal or the version of the analog signal is sampled at a second sampling rate less than the first sampling rate and integrated to provide the integrated signal.

16. The transmitter of claim 15, wherein the error is a timing error, an amplitude error, or both the amplitude error and the timing error.

17. The transmitter of claim 16, wherein the transmitter is used in a data over cable service interface.

18. The transmitter of claim 16, wherein the integrated signal and the error signal are sampled at a sampling rate of $F_S/M$, where $F_S$ is the sampling rate of the digital to analog conversion circuit and M is an integer greater than or equal to 1.

19. The transmitter of claim 18, wherein M is greater than 1.

20. The transmitter of claim 16, wherein the cells each comprise a delay adjustment circuit and an adjustable current source.

* * * * *